United States Patent [19]
Reiner

[11] 4,215,349
[45] Jul. 29, 1980

[54] REMOTE CONTROL SYSTEM FOR AN ELECTRICAL APPARATUS

[75] Inventor: Robert Reiner, Neubiberg, Fed. Rep. of Germany

[73] Assignee: Siemens Aktiengesellschaft, Berlin & Munich, Fed. Rep. of Germany

[21] Appl. No.: 15,003

[22] Filed: Feb. 26, 1979

[30] Foreign Application Priority Data

Mar. 7, 1978 [DE] Fed. Rep. of Germany ....... 2809796

[51] Int. Cl.² .................................................. H04B 7/00
[52] U.S. Cl. ................................................................ 340/695
[58] Field of Search ..................... 340/147 R, 167 R; 325/37, 64, 390; 343/225

[56] References Cited

U.S. PATENT DOCUMENTS

| | | | |
|---|---|---|---|
| 3,784,970 | 1/1974 | Simpkin | 343/225 |
| 4,014,003 | 3/1977 | Beckmann | 343/225 |
| 4,101,886 | 7/1978 | Grimes et al. | 343/225 |

OTHER PUBLICATIONS

K. H. Seidler and R. V. Vignan; Television Technology; vol. 5; 1976; pp. 46–50.
Wermescher; Color Television Technology; vol. 17/503; 1975; pp. 69–72.

Primary Examiner—Alvin H. Waring
Attorney, Agent, or Firm—Hill, Van Santen, Steadman, Chiara & Simpson

[57] ABSTRACT

A remote control system for operating an electrical apparatus has a transmitter for transmitting binary coded commands to a receiver which in turn controls the operation of the electrical apparatus. The apparatus is activated by the receiver in accordance with the received command. Whenever an alteration in the operating condition of the transmitter occurs, a recognition signal is automatically generated and transmitted by the transmitter to signify to the receiver that such an alteration has occurred. The transmitter is equipped to automatically switch off only if it has transmitted the recognition command at least once.

6 Claims, 3 Drawing Figures

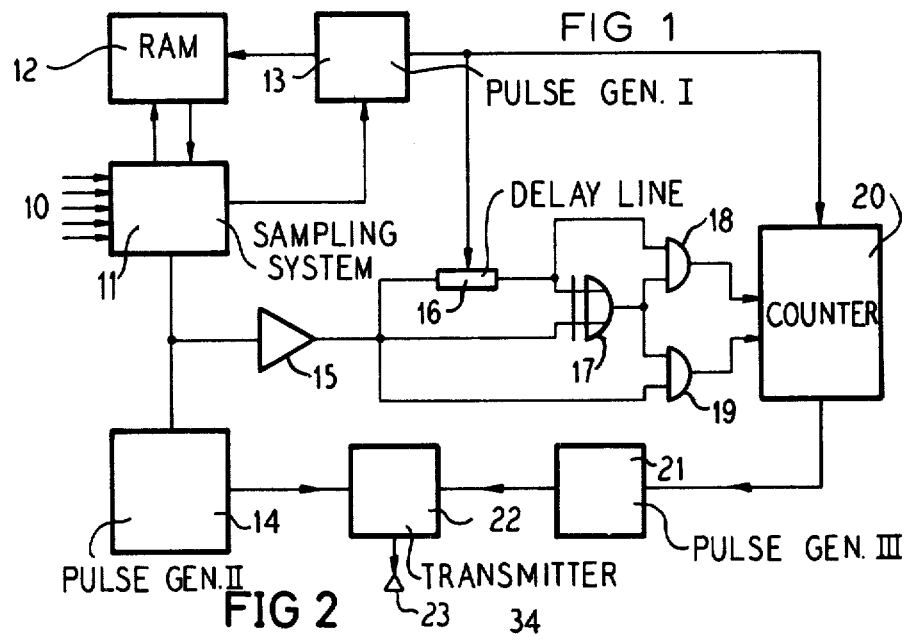
FIG 1
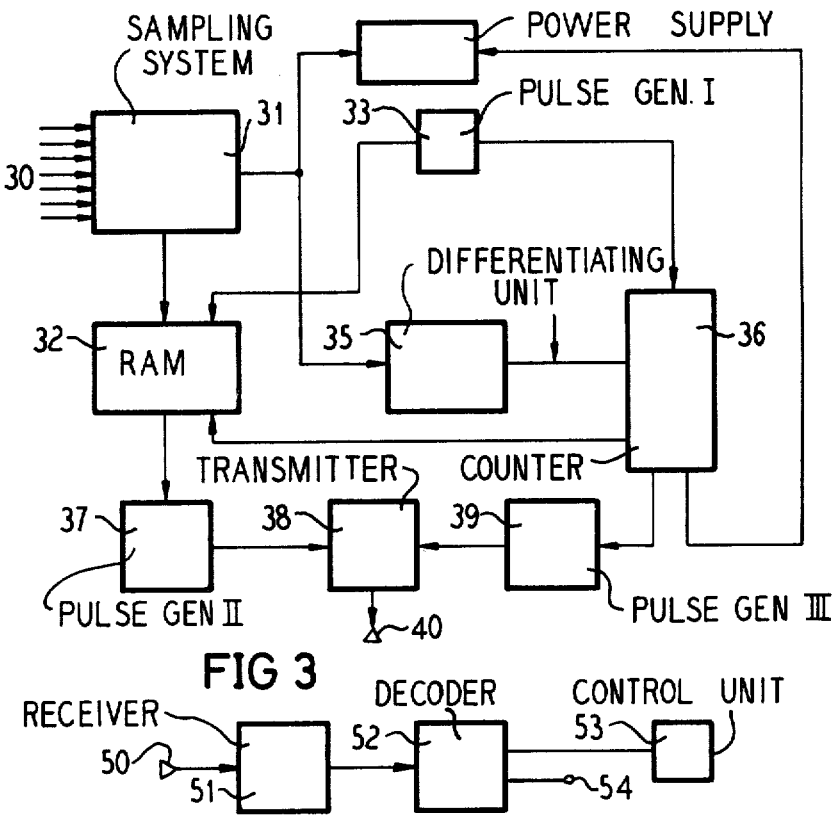
FIG 2
FIG 3

REMOTE CONTROL SYSTEM FOR AN ELECTRICAL APPARATUS

BACKGROUND OF THE INVENTION

1. Field of the Invention

This invention relates to remote control systems for operating an electrical apparatus utilizing transmission of binary coded digital information.

2. Description of the Prior Art

Operation of various electrical apparatus, such as television sets, by a remote control system consisting of a transmitter and a receiver is known in the art. In such systems a command is automatically transmitted by the transmitter in uniform intervals for such a length of time as the operating condition in the transmitter enabling the transmission of the command is maintained, such as continued depression of a push button or key.

There are instances in the use of such systems in which the receiver must recognize whether the operating condition at the transmitter has been interrupted through a brief change in the position of the associated individual switch at the transmitter. It is important for the receiver to recognize whether, during the transmission of a sequence of identical commands, the key at the transmitter has been depressed once for a long period of time or several times briefly. Examples of such situations are when the first depression of the key associated with an alternating command signifies, for example, the switching on of a specific function of the receiver, and the immediately following depression of the key signifies the switching off of the function. A second such situation is the transmission of decimals together with a command, such as for the selection of television channels. A one-time depression of the key may signify the transmission of, for example, the number 3, while a double actuation separated by a brief interval may signify the transmission of the number 33.

To accommodate such situations as above, receivers in the known remote control systems monitor the time between the successive digital signals in the receiver and the corresponding output of the receiver is determined by the respective duration of the signal free time period following the appearance of the last digital signal received. When a designated length of signal free time has been exceeded, the receiver will produce a different operational command to the electrical apparatus than when the digital signal characterizing the transmitted command appears prior to the expiration of this time period. Thus, when the time period has been exceeded, it is assumed by the receiver in the known control systems that the push button has in the interim been released.

Receivers of the type utilized in known remote control systems thus require a switching circuit for the purpose of monitoring and measuring a relatively long time period. Such circuitry requires a considerably increased circuit-cost and, moreover, an increased test time outlay. Additionally, because transmission interferences must be expected, the received pauses need not always be identical with the transmitted pause.

SUMMARY OF THE INVENTION

In accordance with the present invention, a transmitter in a remote control system for operating an electrical apparatus is provided with circuitry to automatically produce and transmit a recognition signal which signifies to the receiver that a change of state has occurred in the input to the transmitter, such as the release of a previously depressed key or push button. The recognition signal is different from any of the commands associated with operation of the electrical apparatus, so that the only information contained in the recognition signal is the fact that a change of state has occurred in the transmitter.

The receiver is provided with a decoder system so that the operating condition of the receiver is changed upon reception of the recognition signal.

Upon the final, or clearing, command which the transmitter transmits subsequent to the release of the command keys the transmitter automatically switches itself off, but only if it has transmitted the final command at least once. The receiver is provided with a differentiator to determine the two different types of operation of the individual transmitter command keys.

BRIEF DESCRIPTION OF THE DRAWINGS

FIG. 1 is a schematic diagram of a remote control transmitter and associated circuitry for generation of a recognition signal.

FIG. 2 is a schematic diagram of a second embodiment of the transmitter of FIG. 1.

FIG. 3 is a schematic diagram of a remote control system receiver for use in association with the transmitters of FIGS. 1 and 2.

DESCRIPTION OF THE PREFERRED EMBODIMENTS

In accordance with the principles of the present invention, a transmitter shown in FIG. 1 is provided with a plurality of inputs 10. The inputs 10 represent any type of actuator for the entry of commands to the transmitter, such as, but not limited to, depressable keys or push buttons. The inputs 10 are directly connected to an interrogation, or sampling, system 11. A random access memory 12 intermediately stores which input has been actuated. The sampling system 11 constantly samples the state of the random access memory 12 at a rate determined by the period of pulses generated by a first pulse generator 13.

Corresponding to the result of the sampling, the coded command corresponding to one of the inputs 10 is produced by a second pulse generator 14. The output of the second pulse generator 14 is sent to a transmitter 22 and transmitted by means of an antenna 23 to a receiver. The transmitter 22 may be an ultrashort waive transmitter or an infrared transmitter as is known in the art. The receiver shown in FIG. 3 is coordinated with the transmission type of the transmitter 22.

The output of the sampling system 11 is not only directed to the second pulse generator 14, but is also directed to a series of logic gates. An amplifier 15 may be provided between the output of the sampling system 11 and the logic gates. The output of the amplifier 15 is split, and one branch thereof is directly connected to an input of an exclusive OR-gate 17.

The output of the amplifier 15 is also connected to an input of a delay line 16. The delay line 16 may be constructed as an RC-delay-flip-flop chain or as a shift register. In any case, the delay line 16 is dimensioned such that the transit time of the command word in the delay line 16 corresponds exactly to a sampling period associated with the sampling system 11. The delay line is connected to the first pulse generator 13 to provide such correspondence. Correspondence between the transit time associated with the delay line 16 and the sampling period of the sampling system 11 means that the transit time of the delay line 16 will also correspond to the period for the transmission, or release, of the coded information from the transmitter 22.

The output of the delay line 16 is connected to a second input of the exclusive OR-gate 17. The output of the delay line 16 also serves as one input to an AND-gate 18, which has as its other input the output of the exclusive OR-gate 17. A second AND-gate 19 also has as one input the output of the exclusive OR-gate 17, and has as its second input the output of the amplifier 15. The outputs of each of the AND-gates 18 and 19 are connected to a counter 20. The counter 20 is also controlled by the pulses generated by the first pulse generator 13.

The counter 20 activates a third pulse generator 21 connected thereto as soon as the state of the counter reaches a specified final value, as described below. The third pulse generator 21 is connected to the transmitter 22 for transmission of the recognition signal.

Operation of the transmitter of FIG. 1 is as follows. Depression of one of the inputs 10 transmits a command signal from the antenna 23 in the conventional manner, as long as the input remains depressed. In such a situation, both inputs to the exclusive OR-gate 17 will be high, so that the output will be low, and because one input to each of the AND-gates 18 and 19 is low, the outputs of both of those gates will also be low. The counter 20 will thus not be activated. Upon release of one of the inputs 10, the input to the exclusive OR-gate 17 which is directly connected to the amplifier 15 will become low, however, the delay line input will remain high for a moment, so that the output of the exclusive OR-gate 17 will be high. The high output of the exclusive OR-gate 17 and the high output of the delay line 16 will result in a high output from the AND-gate 18. Such an output begins operation of the counter 20. Thus, operation of the counter 20 begins only when the transmission of a command is interrupted or terminated through release of one of the inputs 10.

The delay line 16 output will of course return to a low state as soon as the transit time elapses, however, the counter 20 has already begun operation so that a continued input is not necessary. When a second successive input 10 is entered into the sampling system, after elapse of the transit time, the input to the exclusive OR-gate 17 which is directly connected to the output of the amplifier 15 will be high, and the other input corresponding to the output of the delay line 16 will be low, so that again the output of the exclusive OR-gate 17 will be high. The input of the AND-gate 19 directly connected to the output of the amplifier 15 will also be high, so that the output of the AND-gate 19 will be high, and the output of the AND-gate 18 will remain low. A high output from the AND-gate 19 transmitted to the counter 20 stops operation of the counter 20.

The counter 20 activates the third pulse generator 21 as soon as the counter state of the counter 20 reaches a specified terminal or final value. If, for example, a signal occurs only at the output of the AND-gate 19, while the output of the AND-gate 18 remains low, the final signal is transmitted upon reaching the designated end-counter state. If, however, a signal occurs at the output of the AND-gate 19 prior to reaching the end-counter state, the counter 20 is reset and operation is ceased. If, subsequent to the release of a command key, another comman key is depressed immediately thereafter, the transmission operation associated with the previous command word is terminated. Thus, a recognition signal is not generated if the input 10 associated with a respective command is released and immediately depressed again.

A receiver associated with the above described transmitter of FIG. 1 is shown in FIG. 3. The receiver consists of conventional receiver circuitry 51 which is connected to a decoder 52. The decoder 52 is provided with a discriminator for the recognition of the recognition, or final, signal. If the final signal occurs at the input of the decoder 52, a signal appears at an output which is connected to a control unit 53 which operates to change the operating state of the receiver. The normal command signals, on the other hand, are routed by the decoder 52 to an output 54 and are connected in customary fashion to the electrical apparatus to be controlled in accordance with the received commands.

A second embodiment of a transmitter is illustrated in FIG. 2 and is designed such that a final pulse or signal appears each time upon release of a command key. As shown in FIG. 2, a bank of inputs 30 are directly connected to a sampling system 31. The output of the sampling system 31 is connected to a random access memory 32. Depression of one of the inputs 30 also causes the sampling system 31 to activate a power supply 34. The connections of the power supply 34 to various other blocks in FIG. 2 is not shown. The random access memory 32 stores information associated with the depressed input 30.

The memory 32 is periodically sampled at a period defined by the pulse generated by a first pulse generator 33. The coded command word corresponding to one of the inputs 30 is thus periodically emitted by a second pulse generator 37 controlled by the output of the random access memory 32. The information is transmitted by a transmitter 38 and an antenna 40 in the same manner as associated with the transmitter of FIG. 1.

Upon release of the respective input 30 the sampling, or interrogation, system 31 provides a signal to a differentiating circuit 35 which recognizes that release of the input has occurred and transmits a corresponding pulse to a counter 36. The counter 36 activates a third pulse generator 39 which sends a signal to the transmitter 38 for transmission to the receiver 51 signifying that release of one of the inputs 30 has occurred. The counter also switches off the power supply 34 when such a signal is received from the differentiating circuit 35. Operation of the receiver shown in FIG. 3 attached to the controlled electrical apparatus is the same as described in association with the transmitter of FIG. 1.

The remote control systems described above may be utilized to control any electrical apparatus by means of binary coded information. The systems described are particularly suited, but not so limited, for use in controlling the channel selection and other functions of television receivers.

Although various modifications and changes may be suggested by those versed in the art, it is the intention of the inventor to embody within the scope of the patent warranted hereon all such changes and modifications as may reasonably and properly come within the scope of the applicant's contribution to the art.

I claim as my invention:

1. A remote control system for operating an electrical apparatus by means of transmitted binary coded information comprising:

a sampling system having a plurality of user actuated input means which produce binary coded commands, said sampling system producing binary coded commands associated with respective inputs;

a first pulse generator controlled by said sampling system which provides a sampling pulse for said sampling system;

a second pulse generator and associated control means for producing a termination signal upon de-actuation of any of said inputs;

a transmitter connected to said first and second pulse generators for transmitting respective pulses produced by each said generator corresponding to input commands and said termination signal;

a receiver associated with said transmitter for receiving said commands and said termination signal;

a decoder means for discriminating between said command information and said terminal signal which operates to control said apparatus in accordance with respective received commands and which terminates operation of said receiver when said termination signal is received.

2. The remote control system of claim 1 wherein said control means associated with said second pulse generator also operates upon deactivation of any of said inputs to switch off a power supply which supplies current to the system.

3. The remote control system of claim 1 wherein said control means associated with said second pulse generator includes a delay line having a transit time which defines an interval after deactivation of any of said inputs during which subsequent actuation of any of said inputs operates to control said second pulse generator so that a termination signal is not produced.

4. The remote control system of claim 3 wherein said transit time is equal to a sampling period associated with said sampling system produced by said first pulse generator.

5. A remote control system for operating an electrical apparatus by means of transmitted binary coded information comprising:

a sampling system having a plurality of inputs;

a random access memory interconnected with said sampling system for intermediately storing information entered into said sampling system by said inputs;

a first pulse generator associated with said sampling system and connected thereto which provides a pulse for periodically sampling the contents of the random access memory;

a second pulse generator connected to said sampling system for producing pulse commands corresponding to sampled inputs;

a transmitter connected to an output of said second command pulse generator for converting said command pulses into propagatable electromagnetic waives;

an amplifier having an input connected to an output of said sampling system;

a delay line having an input connected to an output of said amplifier, said delay line connected to said first pulse generator so that said delay line has a transit time equivalent to a period of a pulse generator by said first pulse generator;

an exclusive OR-gate having one input connected to an output of said delay line and a second input connected to the output of said amplifier;

a first AND-gate having an input connected to the output of said delay line and a second input connected to an output of said exclusive OR-gate;

a second AND-gate having an input connected to the output of said exclusive OR-gate and a second input connected to the output of said amplifier;

a counter having inputs respectively connected to outputs of said first and second AND-gates and for which said first pulse generator is a clock;

whereby said counter is activated upon deactuation of any of said inputs to said sampling system and which after elapse of a specified number of clock pulses from said first pulse generator activates a third pulse generator connected to said transmitter for production and transmission of a termination signal, said counter further being deactivated so that so termination signal is produced upon subsequent actuation of any of said inputs to said sampling system during an interval after deactuation of any of said inputs of said sampling system less than said transit time;

a first antenna attached to said transmitter for propagation of said electromagnetic waives representing said pulse commands and said termination signal;

a second antenna for receiving said propagated electromagnetic waives;

a receiver attached to said second antenna for converting said electromagnetic waives back into binary coded information; and a decoder connected to said receiver for determining whether a pulse command or a termination signal has been received, a switching means included in said decoder which directs received command pulses to the controlled electrical apparatus and which directs received termination signals to a control unit for terminating operation of the controlled electrical apparatus.

6. A remote control system for operating an electrical apparatus by means of transmitted binary coded information comprising:

a sampling system having a plurality of inputs;

a random access memory interconnected with said sampling system for intermediately storing information entered by said inputs;

a first pulse generator connected to said random access memory for providing a sampling pulse for said sampling system to periodically sample the contents of said random access memory;

a second pulse generator connected to an output of said random access memory for producing pulse commands corresponding to sampled inputs of said sampling system;

a transmitter connected to said second pulse generator for converting said pulse commands into propagatable electromagnetic waives;

a differentiating unit connected to a second output of said sampling system;

a counter having an input connected to an output of said differentiating unit and for which said first pulse generator serves as a clock;

a power supply for supplying power to all components of said system, said power supply activated by any input to said sampling system;

a third pulse generator connected to an output of said counter, whereby deactuation of any of said inputs of said sampling system operates to produce a signal to said differentiating unit which begins operation of said counter which after a specified number of clock pulses activates said third pulse generator to produce a termination signal, said counter connected to said power supply to simultaneously deactivate the power supply after said specified period;

said pulse generator connected to said transmitter;

a first antenna connected to said transmitter for propagation of said electromagnetic waives representing pulse commands and said termination signal;

a second antenna for receiving said electromagnetic waives;

a receiver for converting said electromagnetic waives back into binary coded information; and a decoder connected to said receiver for determining whether a pulse command or a termination signal has been received, a switching means included in said decoder which transmits said pulse commands to said controlled electrical apparatus and which transmits said termination signal to a control unit for termination of operation of said controlled electrical apparatus.

* * * * *